(12) United States Patent
Srinivasan et al.

(10) Patent No.: US 10,177,215 B1
(45) Date of Patent: Jan. 8, 2019

(54) ANALOG CAPACITOR ON SUBMICRON PITCH METAL LEVEL

(71) Applicant: Texas Instruments Incorporated, Dallas, TX (US)

(72) Inventors: Bhaskar Srinivasan, Allen, TX (US); Guru Mathur, Plano, TX (US); Stephen Arlon Meisner, Allen, TX (US); Shih Chang Chang, Allen, TX (US); Corinne Ann Gagnet, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/793,690

(22) Filed: Oct. 25, 2017

(51) Int. Cl.
| | |
|---|---|
| H01L 49/02 | (2006.01) |
| H01L 27/108 | (2006.01) |
| H01L 29/66 | (2006.01) |
| H01L 27/06 | (2006.01) |
| H01L 29/16 | (2006.01) |
| H01L 21/02 | (2006.01) |
| H01L 21/768 | (2006.01) |
| H01L 29/94 | (2006.01) |

(52) U.S. Cl.
CPC .......... *H01L 28/40* (2013.01); *H01L 21/0214* (2013.01); *H01L 21/02164* (2013.01); *H01L 21/76829* (2013.01); *H01L 27/0629* (2013.01); *H01L 27/10805* (2013.01); *H01L 29/1608* (2013.01); *H01L 29/66181* (2013.01); *H01L 29/94* (2013.01)

(58) Field of Classification Search
CPC ............. H01L 27/0805; H01L 27/0629; H01L 27/10805; H01L 27/10852; H01L 27/10861; H01L 28/40; H01L 29/6618; H01L 21/02164; H01L 21/02178; H01L 21/0228; H01L 21/82
See application file for complete search history.

(56) References Cited

U.S. PATENT DOCUMENTS

| | | | |
|---|---|---|---|
| 6,576,526 B2 * | 6/2003 | Kai | H01L 21/31122 257/E21.009 |
| 2003/0052365 A1 | 3/2003 | Chaudhry | |
| 2007/0105332 A1 * | 5/2007 | Wofford | H01L 28/40 438/381 |

FOREIGN PATENT DOCUMENTS

EP         525464 A1    2/1993

* cited by examiner

*Primary Examiner* — Karen Kusumakar
(74) *Attorney, Agent, or Firm* — Andrew R. Ralston; Charles A. Brill; Frank D. Cimino

(57) ABSTRACT

A microelectronic device includes a capacitor having a lower plate of interconnect metal, a capacitor dielectric layer with a lower silicon dioxide layer, a silicon oxy-nitride layer, and an upper silicon dioxide layer, and an upper plate over the capacitor dielectric layer. The silicon oxy-nitride layer has an average index of refraction of 1.85 to 1.95 at a wavelength of 248 nanometers. To form the microelectronic device, the lower silicon dioxide layer, the silicon oxy-nitride layer, and the upper silicon dioxide layer are formed in sequence over an interconnect metal layer. The upper plate is formed, leaving the lower silicon dioxide layer, the silicon oxy-nitride layer, and at least a portion of the upper silicon dioxide layer over the interconnect metal layer. An interconnect mask is formed of photoresist over the upper plate and the silicon oxy-nitride layer, using the silicon oxy-nitride layer as an anti-reflection layer.

20 Claims, 13 Drawing Sheets

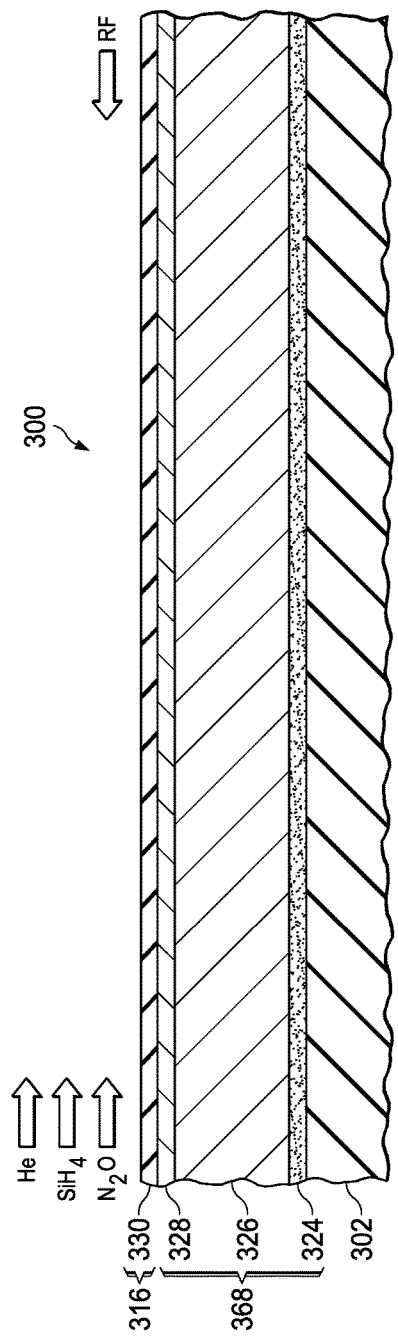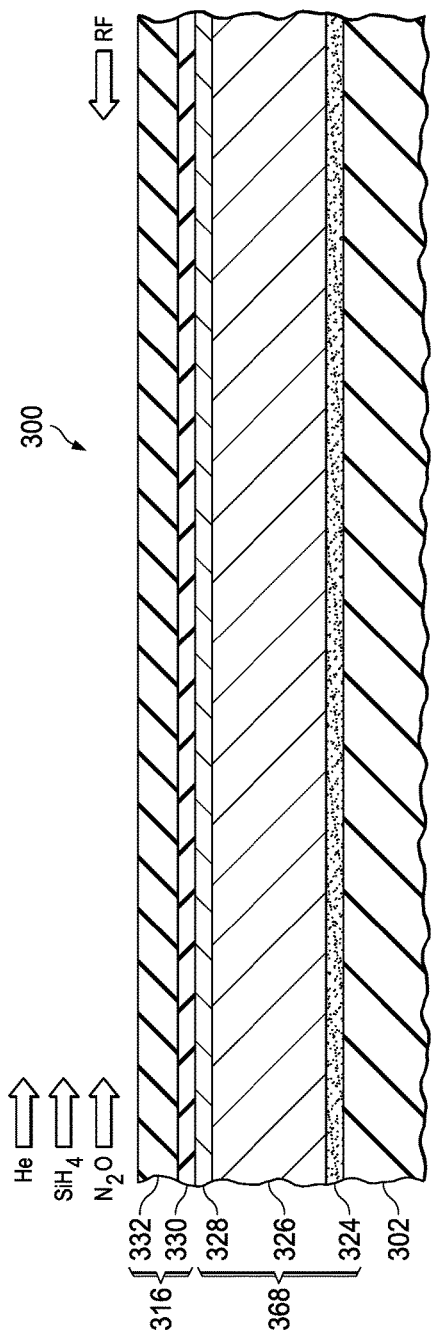
FIG. 3A
FIG. 3B

ANALOG CAPACITOR ON SUBMICRON PITCH METAL LEVEL

FIELD

This disclosure relates to the field of microelectronic devices. More particularly, this disclosure relates to capacitors in microelectronic devices.

BACKGROUND

A microelectronic device may include a capacitor in the interconnect region. The lower plate of the capacitor may be a metal layer that is part of an interconnect level, to reduce cost and complexity of the microelectronic device. The interconnect level may include interconnects of etched aluminum. There are several desirable characteristics of the capacitor. A first desirable characteristic is high capacitance density, which may be expressed as a high ratio of the capacitance to the area occupied by the capacitor. A second desirable characteristic is low variations in the capacitance over the range of voltages applied to the capacitor. A third desirable characteristic is high reliability, which may be understood as meeting the first and second desirable characteristics for an expected operational lifetime of the microelectronic device under the expected operating conditions of the microelectronic device. A fourth desirable characteristic is compatibility of the capacitor fabrication operation with the patterning steps used to form the etch mask for the interconnect level containing the lower plate of the capacitor. Such a desirable characteristic places limitations on the thickness and composition of the capacitor dielectric layer over the lower plate. Attaining all four desirable characteristics simultaneously has been problematic.

SUMMARY

A microelectronic device which includes a capacitor having a lower plate of interconnect metal is disclosed. The capacitor dielectric layer has a lower silicon dioxide layer over the lower plate, a silicon oxy-nitride layer over the lower silicon dioxide layer, and an upper silicon dioxide layer over the silicon oxy-nitride layer. An upper plate of the capacitor is located over the upper silicon dioxide layer. The silicon oxy-nitride layer has an average index of refraction of 1.85 to 1.95 at a wavelength of 248 nanometers. The upper plate is recessed from a lateral perimeter of the lower plate. The lower silicon dioxide layer, the silicon oxy-nitride layer, and a portion of the upper silicon dioxide layer extend past the upper plate on the lower plate. A method of forming the microelectronic device is disclosed. An interconnect metal layer is formed on the microelectronic device. The lower silicon dioxide layer, the silicon oxy-nitride layer, and the upper silicon dioxide layer are formed in sequence over the interconnect metal layer. An upper plate layer is formed over the upper silicon dioxide layer. The upper plate layer is patterned to form the upper plate, leaving the lower silicon dioxide layer, the silicon oxy-nitride layer and a portion of the upper silicon dioxide layer over the interconnect metal layer. An interconnect mask is formed of photoresist over the upper plate and the silicon oxy-nitride layer, covering areas for the lower plate and for an interconnect, using the lower silicon dioxide layer, the silicon oxy-nitride layer and the portion of the upper silicon dioxide layer as an anti-reflection layer. The interconnect layer is removed where exposed by the interconnect mask, leaving the lower plate and the interconnect.

BRIEF DESCRIPTION OF THE VIEWS OF THE DRAWINGS

FIG. 3A through FIG. 3L are cross sections of a microelectronic device which includes a capacitor having a lower plate of interconnect metal, depicted in successive stages of an example method of formation.

DETAILED DESCRIPTION

Figure 1:
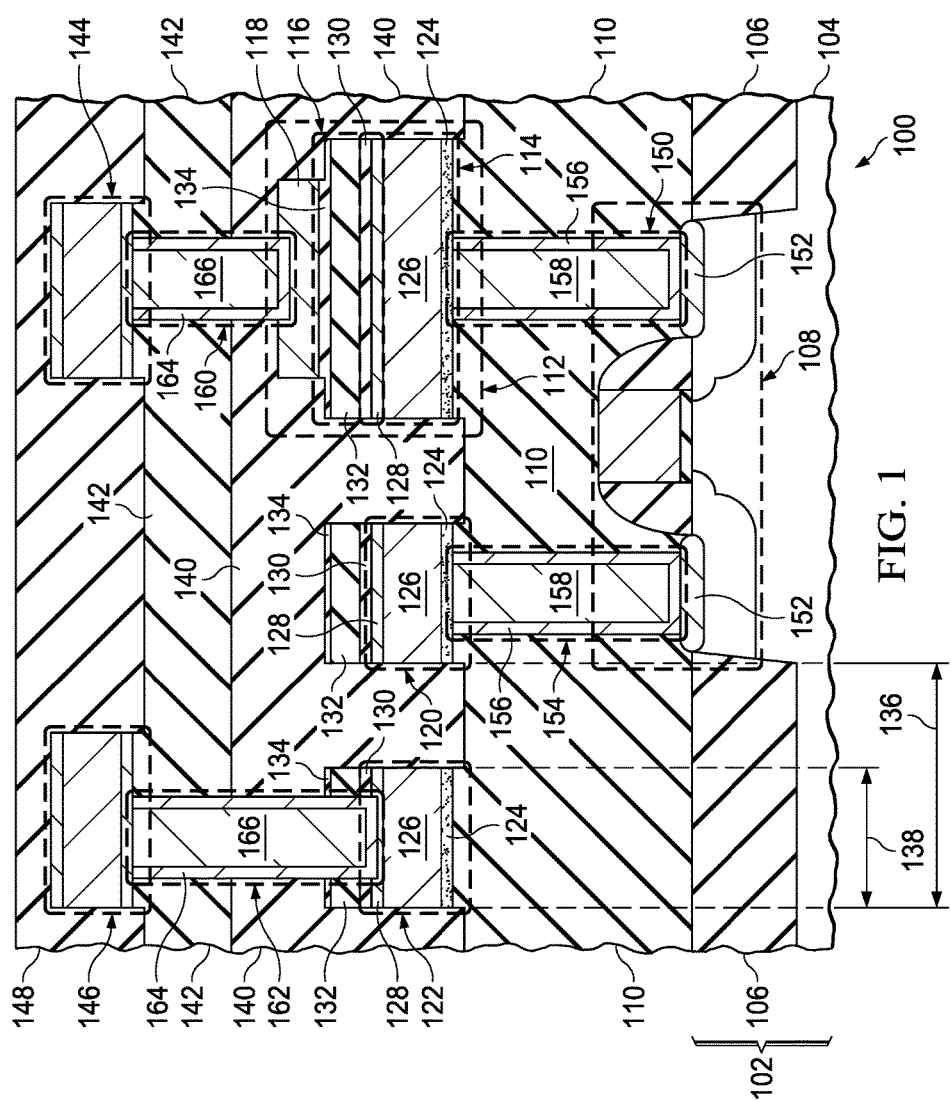
FIG. 1 is a cross section of an example microelectronic device which includes a capacitor having a lower plate of interconnect metal.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

The following co-pending patent application is related and hereby incorporated by reference: U.S. patent application Ser. No. 15/793,607. With its mention in this section, this patent application is not admitted to be prior art with respect to the present invention.

A microelectronic device includes a capacitor in the interconnect region. The lower plate of the capacitor is a metal layer that is part of an interconnect level. A capacitor dielectric layer on the lower plate includes a lower silicon dioxide layer over the lower plate, a silicon oxy-nitride layer over the lower silicon dioxide layer, and an upper silicon dioxide layer over the silicon oxy-nitride layer. The lower silicon dioxide layer has a thickness of 3 nanometers to 7 nanometers. The silicon oxy-nitride layer has a thickness of 20 nanometers to 30 nanometers. The silicon oxy-nitride layer has an average value of a real part of an index of refraction, commonly referred to as simply the index of refraction, and commonly represented by the letter n, of 1.85 to 1.95 at a wavelength of 248 nanometers. The silicon oxy-nitride layer may have an average value of the imaginary part of the index of refraction, commonly represented by the letter k, of 0.020 to 0.045 at a wavelength of 248 nanometers. The upper silicon dioxide layer may have a thickness of 8 nanometers to 12 nanometers. An upper plate of the capacitor is located over the upper silicon dioxide layer. The upper plate has a thickness of 100 nanometers to 150 nanometers. The upper plate is recessed from a lateral perimeter of the lower plate. The lower silicon dioxide layer, the silicon oxy-nitride layer, and a portion of the upper silicon dioxide layer extend past the upper plate on the lower plate. The upper silicon dioxide layer has a thickness sufficient to enable an etch process used to form the upper plate to stop in the upper silicon dioxide layer, leaving a sufficient thickness of the upper silicon dioxide layer to prevent nitrogen poisoning by the silicon oxy-nitride layer of a subsequent photolithographic process to pattern the lower plate.

To form the microelectronic device, an interconnect metal layer is formed on a dielectric layer of the microelectronic device. The lower silicon dioxide layer, the silicon oxy-nitride layer, and the upper silicon dioxide layer are formed in sequence, and optionally in situ, over the interconnect metal layer. An upper plate layer is formed over the upper silicon dioxide layer. The upper plate layer is patterned to form the upper plate, leaving the lower silicon dioxide layer, the silicon oxy-nitride layer, and at least 3 nanometers of the upper silicon dioxide layer over the interconnect metal layer outside of the upper plate. A layer of photoresist is formed over the upper plate and the remaining portion of the upper silicon dioxide layer. The lower silicon dioxide layer, the silicon oxy-nitride layer, and the remaining portion of the upper silicon dioxide layer over the interconnect metal layer advantageously provide an anti-reflection layer for the photoresist. In this context, an anti-reflection layer provides a reflectivity less than 30 percent at a wavelength of 248 nanometers in a photolithography tool used to form a photoresist pattern over the interconnect metal layer. The photoresist is patterned by a photolithographic process to form an interconnect mask defining areas for a lower plate of the capacitor and interconnects in the interconnect metal layer. The silicon oxy-nitride layer having an average value of the index of refraction of 1.85 to 1.95 may provide sufficient anti-reflection performance to enable patterning the photoresist at a pitch less than 420 nanometers. Furthermore, use of the capacitor dielectric layer as the anti-reflection layer may provide a uniformity of a linewidth of the interconnect mask, commonly referred to as critical dimension (CD) uniformity, better than 10 nanometers across a 300 millimeter diameter wafer.

A lower average index of refraction of the silicon oxy-nitride layer, or removal of a portion of the silicon oxy-nitride layer during etching the upper plate layer, would not enable patterning the photoresist at a pitch less than 420 nanometers. Use of the lower silicon dioxide layer, the silicon oxy-nitride layer, and the remaining portion of the upper silicon oxy-nitride layer to provide the anti-reflection layer may advantageously reduce cost and complexity of the photolithographic process compared to applying a separate anti-reflection layer such as an organic bottom anti-reflection coat (BARC). The interconnect metal layer is etched using the interconnect mask to concurrently form the lower plate of the capacitor and the interconnects.

The capacitor has a capacitance density greater than 1 femtofarad per square micron (fF/µm2), and a breakdown voltage greater than 20 volts, provided by the capacitor dielectric layer having the silicon oxy-nitride layer between the lower silicon dioxide layer and the upper silicon dioxide layer, and by the silicon oxy-nitride layer having an average value of the index of refraction of 1.85 to 1.95 at a wavelength of 248 nanometers. A lower average index of refraction of the silicon oxy-nitride layer would undesirably produce a lower capacitance density. Furthermore, the capacitor may have a linear voltage coefficient of −18 parts per million (ppm) to +18 ppm, and a quadratic voltage coefficient of −1 ppm to +3 ppm, over a voltage range of −10 volts to +10 volts. A capacitance of the capacitor, as a function of a voltage applied to the upper plate relative to the lower plate, may be expressed as $$C(V)=C_0\times[1+(\alpha\times V^2)+(\beta\times V)]$$

where V is the voltage applied to the upper plate relative to the lower plate,
$C(V)$ is the capacitance at the applied voltage V,
$C_0$ is the capacitance at zero applied voltage,
$\beta$ is the linear voltage coefficient, and
$\alpha$ is the quadratic voltage coefficient.

The values of the linear voltage coefficient and the quadratic voltage coefficient result from the dielectric constant of the silicon oxy-nitride layer in combination with having the silicon oxy-nitride layer between the lower silicon dioxide layer and the upper silicon dioxide layer, and advantageously provide a variation in the capacitance less than 200 parts per million over the range of −10 volts to +10 volts. A higher average index of refraction of the silicon oxy-nitride layer would produce an undesirable higher value of the quadratic voltage coefficient. The structure of the capacitor dielectric layer, in particular a low defect density at interfaces between the lower plate and the lower silicon dioxide layer, between the lower silicon dioxide layer and the silicon oxy-nitride layer, and between the silicon oxy-nitride layer and the upper silicon dioxide layer, further advantageously provides reliable operation greater than 10 years under operating conditions of 5 volts at 150° C.

It is noted that terms such as "top," "over," "above," and "below" may be used in this disclosure. These terms should not be construed as limiting the position or orientation of a structure or element, but should be used to provide spatial relationship between structures or elements. For the purposes of this disclosure, the term "lateral" is understood to refer to a direction parallel to a plane of the top surface of the microelectronic device, and the term "vertical" is understood to refer to a direction perpendicular to the plane of the instant top surface of the microelectronic device.

FIG. 1 is a cross section of an example microelectronic device which includes a capacitor having a lower plate of interconnect metal. The microelectronic device 100 has a substrate 102 which may include semiconductor material 104 and may further include field oxide 106. The microelectronic device 100 may include an active component 108, depicted in FIG. 1 as a metal oxide semiconductor (MOS) transistor. The microelectronic device 100 includes a lower dielectric layer 110 above the substrate 102. In the instant example, the lower dielectric layer 110 may be a pre-metal dielectric (PMD) layer having one or more sub-layers of dielectric material, for example a PMD liner of silicon nitride over the substrate 102, a layer of silicon dioxide-based material formed by a high density plasma (HDP) or a plasma enhanced chemical vapor deposition (PECVD) process using tetraethyl orthosilicate (TEOS) and ozone, a layer of silicon dioxide-based material such as phosphosilicate glass (PSG) or borophosphosilicate glass (BPSG), and a cap layer of silicon nitride, silicon oxy-nitride, silicon carbide or silicon carbide nitride.

The capacitor 112 is located on the lower dielectric layer 110. The capacitor 112 includes a lower plate 114 on the lower dielectric layer 110, a capacitor dielectric layer 116 on the lower plate 114, and an upper plate 118 on the capacitor dielectric layer 116.

The microelectronic device 100 further includes a first lower interconnect 120 and a second lower interconnect 122, separate from the lower plate 114, on the lower dielectric layer 110. The lower plate 114, first lower interconnect 120, and the second lower interconnect 122 have similar structures and compositions, which, in the instant example, include an adhesion layer 124 on the lower dielectric layer 110, an aluminum layer 126 on the adhesion layer 124, and a cap layer 128 on the aluminum layer 126. The adhesion layer 124 may include one or more layers of titanium, titanium tungsten, titanium nitride, or such. The aluminum layer 126 may include primarily aluminum, with a few percent of titanium, silicon, copper, or such, to improve resistance to electromigration. The cap layer 128 may include titanium nitride, tantalum nitride, or other electrically conductive material appropriate for reducing hillock formation in the underlying aluminum layer 126, which may improve a breakdown voltage and reliability of the capacitor 112.

The capacitor dielectric layer 116 includes a lower silicon dioxide layer 130 on the lower plate 114, a silicon oxy-nitride layer 132 on the lower silicon dioxide layer 130, and an upper silicon dioxide layer 134 on the silicon oxy-nitride layer 132. The lower silicon dioxide layer 130 is 3 nanometers to 7 nanometers thick, and may contain a few atomic percent nitrogen, for example up to 5 atomic percent. The silicon oxy-nitride layer 132 is 20 nanometers to 30 nanometers thick, and has an average value of the real part of the index of refraction, commonly referred to as simply the index of refraction, and commonly represented by the letter n, of 1.85 to 1.95 at a wavelength of 248 nanometers. The silicon oxy-nitride layer 132 may have an average value of the imaginary part of the index of refraction, commonly referred to by the letter k, of 0.020 to 0.045 at a wavelength of 248 nanometers. The upper silicon dioxide layer 134 is 8 nanometers to 12 nanometers thick, and may contain a few atomic percent nitrogen, for example up to 5 atomic percent.

The upper plate 118 is 100 nanometers to 150 nanometers thick. The upper plate 118 may include one or more layers of titanium nitride, tantalum nitride, or such. The upper plate 118 is recessed from a lateral perimeter of the lower plate 114, and the lower silicon dioxide layer 130, the silicon oxy-nitride layer 132, and a portion of the upper silicon dioxide layer 134 extend past the upper plate 118 on the lower plate 114. The portion of the upper silicon dioxide layer 134 that extends past the upper plate 118 has a thickness sufficient to prevent nitrogen poisoning of photoresist from the underlying silicon oxy-nitride layer 132, for example, 3 nanometers. Furthermore in the instant example, the lower silicon dioxide layer 130, the silicon oxy-nitride layer 132, and the portion of the upper silicon dioxide layer 134 are located on the first lower interconnect 120 and on the second lower interconnect 122.

The lower plate 114, the first lower interconnect 120, and the second lower interconnect 122 are elements of a lower interconnect level on the lower dielectric layer 110. The elements of the lower interconnect level may have a minimum pitch 136, depicted in FIG. 1 as the pitch of the first lower interconnect 120 and the second lower interconnect 122, less than 420 nanometers. The pitch 136 may be expressed as a sum of a width 138 of the second lower interconnect 122 and a width of a space between the first lower interconnect 120 and the second lower interconnect 122, as depicted in FIG. 1. The elements of the lower interconnect level may be formed with the minimum pitch less than 420 nanometers using a 248 nanometer lithography process, by using the lower silicon dioxide layer 130, the silicon oxy-nitride layer 132, and the portion of the upper silicon dioxide layer 134 as an anti-reflection layer in the 248 nanometer lithography process.

A lower intra-metal dielectric (IMD) layer 140 is disposed over the lower dielectric layer 110, the capacitor 112, and the first lower interconnect 120 and the second lower interconnect 122. The lower IMD layer 140 may include one or more sublayers of dielectric material, for example an etch stop layer of silicon nitride, and a main dielectric layer of silicon dioxide or low-k dielectric material on the etch stop layer. A top surface of the lower IMD layer 140 may be planar, as indicated in FIG. 1. An inter-level dielectric (ILD) layer 142 is disposed on the lower IMD layer 140. The ILD layer 142 may include one or more dielectric sublayers, such as a main dielectric layer of silicon dioxide or low-k dielectric material on the lower IMD layer 140, and a cap layer of silicon nitride, silicon carbide, silicon oxy-nitride, silicon oxy-carbide, or the like, on the main dielectric layer. Other dielectric layer structures over the lower dielectric layer 110, the capacitor 112, the first lower interconnect 120, and the second lower interconnect 122 are within the scope of the instant example.

In the instant example, a first upper interconnect 144 is located on the ILD layer 142 over the upper plate 118, and a second upper interconnect 146 is located on the ILD layer 142 over the second lower interconnect 122. The first upper interconnect 144 and the second upper interconnect 146 have similar structures, as a result of being formed concurrently in a same interconnect level of the microelectronic device 100. The first upper interconnect 144 and the second upper interconnect 146 may have sublayers with similar compositions to the sublayers of the lower plate 114, the first lower interconnect 120, and the second lower interconnect 122. An upper IMD layer 148 is disposed on the ILD layer 142, the first upper interconnect 144, and the second upper interconnect 146. The upper IMD layer 148 may have a similar structure to the lower IMD layer 140.

In the instant example, the lower plate 114 may be electrically coupled to the active component 108 through a first contact 150. The first contact 150 may optionally be coupled to the active component 108 through metal silicide 152 on the substrate 102. The first lower interconnect 120 may similarly be coupled to the active component 108 through a second contact 154, also optionally through the metal silicide 152. The first contact 150 and the second contact 154 may include liners 156 and fill metal 158 on the liners 156. The liners 156 may include titanium, titanium nitride, tantalum, tantalum nitride, or other such diffusion barrier metal. The fill metal 158 may include tungsten or such other metal amenable to metal organic chemical vapor deposition (MOCVD) or atomic layer deposition (ALD) processes.

The first upper interconnect 144 is electrically coupled to the upper plate 118 through a first via 160, and the second upper interconnect 146 is electrically coupled to the second lower interconnect 122 through a second via 162. The second via 162 extends through the lower silicon dioxide layer 130, the silicon oxy-nitride layer 132, and the portion of the upper silicon dioxide layer 134 on the second lower interconnect 122. The first via 160 and the second via 162 have similar structures and compositions. In the instant example, the first via 160 and the second via 162 each have a liner 164 and fill metal 166 on the liner 164. The liners 164 have similar compositions, as a result of being formed concurrently. The fill metal 166 in each of the vias 160 and 162 also have similar compositions, as a result of being formed concurrently. The liners 164 may include, for example, titanium, titanium nitride, or tantalum nitride. The fill metal 166 may include, for example, tungsten, copper or aluminum. Having electrical connections from the capacitor 112 and the second lower interconnect 122, to the upper interconnects 144 and 146 in the same interconnect level may advantageously provide a more compact and simpler configuration compared with more complicated connections, advantageously reducing a cost of the microelectronic device 100.

Figure 2:
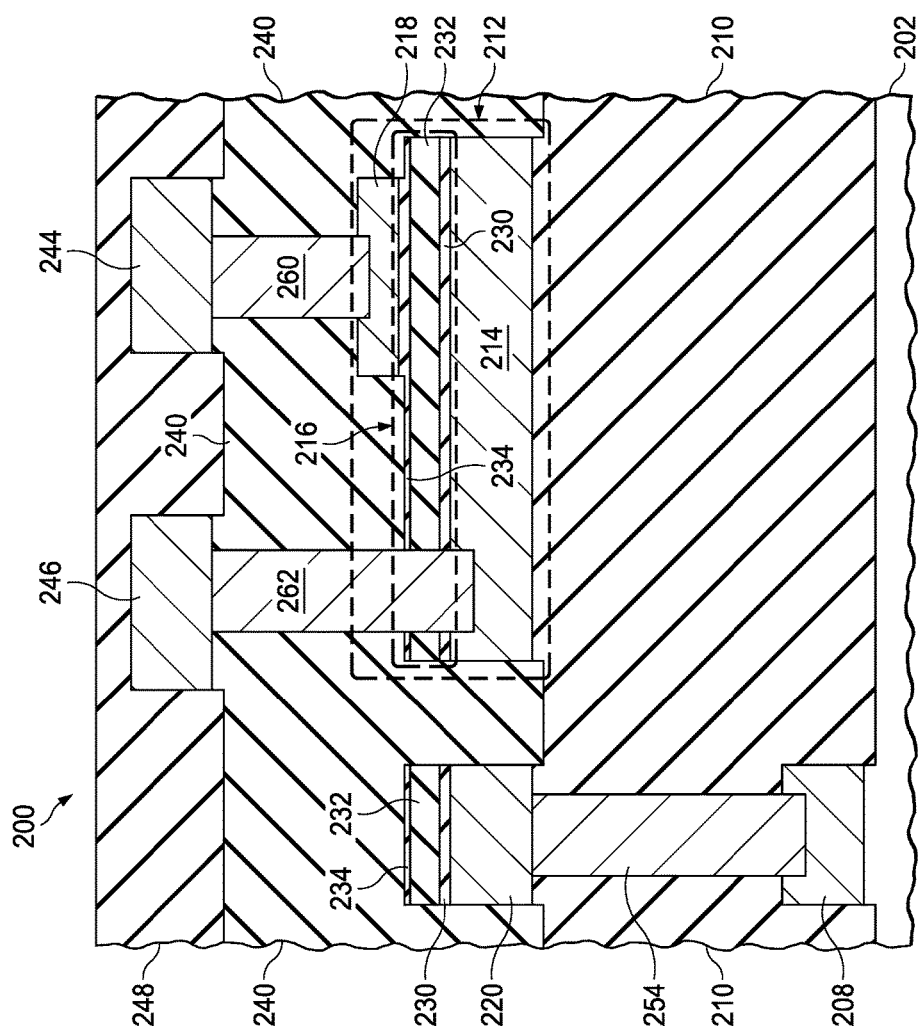
FIG. 2 is a cross section of another example microelectronic device which includes a capacitor having a lower plate of interconnect metal.

FIG. 2 is a cross section of another example microelectronic device which includes a capacitor having a lower plate of interconnect metal. The microelectronic device 200 has a lower layer 202, which may be a semiconductor substrate, field oxide, or a dielectric layer in an interconnect region of the microelectronic device 200. A component 208 is located on the lower layer 202. The component 208 may be, for example, an active component such as a transistor, a passive component such as a resistor, or an interconnect. The microelectronic device 200 includes a first dielectric layer 210 over the lower layer 202 and the component 208. In one version of the instant example, the first dielectric layer 210 may be a PMD layer. In another version, the first dielectric layer 210 may be a combined IMD layer and ILD layer, as described in reference to the lower IMD layer 140 and the ILD layer 142 of FIG. 1. Other structures for the first dielectric layer 210 are within the scope of the instant example.

The capacitor 212 is located on the first dielectric layer 210. The capacitor 212 includes a lower plate 214 on the first dielectric layer 210. The capacitor 212 further includes a capacitor dielectric layer 216 on the lower plate 214. The capacitor dielectric layer 216 includes a lower silicon dioxide layer 230 on the lower plate 214, a silicon oxy-nitride layer 232 on the lower silicon dioxide layer 230, and an upper silicon dioxide layer 234 on the silicon oxy-nitride layer 232. The lower silicon dioxide layer 230, the silicon oxy-nitride layer 232, and the upper silicon dioxide layer 234 have structures and compositions as disclosed in reference to the capacitor dielectric layer 116 of FIG. 1. The capacitor 212 further includes an upper plate 218 on the capacitor dielectric layer 216. The upper plate 218 may have the thickness and the composition disclosed in reference to the upper plate 118 of FIG. 1. In the instant example, the upper plate 218 is recessed from a lateral perimeter of the lower plate 214, and the lower silicon dioxide layer 230, the silicon oxy-nitride layer 232, and a portion of the upper silicon dioxide layer 234 extend past the upper plate 218 on the lower plate 214.

The microelectronic device 200 further includes a lower interconnect 220 on the first dielectric layer 210. The lower interconnect 220 has a composition and a structure similar to the lower plate 214, as a result of being formed concurrently. The lower silicon dioxide layer 230, the silicon oxy-nitride layer 232, and the portion of the upper silicon dioxide layer 234 extend over the lower interconnect 220. In the instant example, the lower interconnect 220 may be coupled to the component 208 through a vertical connector 254, which may be, for example, a contact if the first dielectric layer 210 is a PMD layer, or may be a via if the first dielectric layer 210 is a combined IMD layer and ILD layer.

A second dielectric layer 240 is disposed over the first dielectric layer 210, the capacitor 212, and the lower interconnect 220. The second dielectric layer 240 may be a combined IMD layer and ILD layer, or may have another structure and composition. A first upper interconnect 244 is located on the second dielectric layer 240 over the upper plate 218. A second upper interconnect 246 is located on the second dielectric layer 240 over a portion of the lower plate 214 extending past the upper plate 218. The first upper interconnect 244 and the second upper interconnect 246 are in a same interconnect level of the microelectronic device 200. A third dielectric layer 248 is disposed on the second dielectric layer 240, the first upper interconnect 244, and the second upper interconnect 246. In the instant example, the first upper interconnect 244 is electrically coupled to the upper plate 218 through a first via 260, and the second upper interconnect 246 is electrically coupled to the lower plate 214 through a second via 262. The second via 262 extends through the portion of the upper silicon dioxide layer 234, the silicon oxy-nitride layer 232, and the lower silicon dioxide layer 230 on the lower plate 214. The first via 260 and the second via 262 may have similar structures and compositions, as a result of being formed concurrently. Having electrical connections from the capacitor 212 and the lower plate 214 to the upper interconnects 244 and 246 in the same interconnect level may advantageously provide a more compact and simpler configuration compared with more complicated connections, advantageously reducing a cost of the microelectronic device 200.

FIG. 3A through FIG. 3L are cross sections of a microelectronic device which includes a capacitor having a lower plate of interconnect metal, depicted in successive stages of an example method of formation. Values of some process parameters, such as flow rates of reagent gases and power levels of applied radio frequency (RF) power, disclosed in the instant example, are appropriate for forming the microelectronic device on a 300 millimeter diameter wafer. The values of these process parameters may be scaled appropriately for forming the microelectronic device on a different size wafer. Other process parameters, such as temperature and pressure, do not scale directly with wafer size.

Referring to FIG. 3A, the microelectronic device 300 has a lower dielectric layer 302 which may be, for example, a PMD layer or an ILD layer. The lower dielectric layer 302 may include one or more layers of dielectric material, such as a main dielectric layer of silicon dioxide, PSG, BPSG, or low-k dielectric material, and a cap layer of silicon nitride, silicon carbide, or other material suitable for a stop layer for a chemical mechanical polish (CMP) operation. An interconnect metal layer 368 is formed over the lower dielectric layer 302. The interconnect metal layer 368 may include, for example, an adhesion layer 324 formed on the lower dielectric layer 302. The adhesion layer 324 may include titanium, titanium tungsten, or titanium nitride, or such, formed by evaporation, sputtering, or an ALD process. The interconnect metal layer 368 may include an aluminum layer 326 formed on the adhesion layer 324 by sputtering. The aluminum layer 326 may include primarily aluminum, with a few atomic percent of silicon, titanium, copper, or the like, to reduce electromigration. The interconnect metal layer 368 may further include a cap layer 328 formed on the aluminum layer 326. The cap layer 328 may include titanium nitride or such, formed by reactive sputtering, or an ALD process.

A lower silicon dioxide layer 330 of a capacitor dielectric layer 316 is formed over the interconnect metal layer 368. The lower silicon dioxide layer 330 may be formed, for example, by a first PECVD process. During formation of the lower silicon dioxide layer 330, a temperature of the interconnect metal layer 368 is maintained below a hillock formation temperature which causes formation of hillocks in the aluminum layer 326. The first PECVD process may include heating the microelectronic device 300 to 300° C. to 400° C. Silane (SiH4) gas, denoted as "SiH$_4$" in FIG. 3A, is provided at a flow rate of 30 sccm to 50 sccm, for a 300 millimeter diameter wafer. For other wafer sizes, the silane gas may be provided at a flow rate of 0.04 sccm to 0.07 sccm per square centimeter of wafer area. Nitrous oxide (N$_2$O) gas, denoted as "N$_2$O" in FIG. 3A, is provided at a flow rate 30 to 40 times the flow rate of the silane gas. A carrier gas such as helium (He) gas, denoted as "He" in FIG. 3A, is provided at a flow rate of 6,000 sccm to 10,000 sccm, for a 300 millimeter diameter wafer. For other wafer sizes, the carrier gas may be provided at a flow rate of 8.5 sccm to 14.1 sccm per square centimeter of wafer area. A pressure of the silane gas, the nitrous oxide gas, and the carrier gas is maintained at 7 torr to 10 torr. RF power, denoted as "RF" in FIG. 3A, is applied to the silane gas, the nitrous oxide gas, and the carrier gas at a power level of 250 watts to 400 watts, for a 300 millimeter diameter wafer, to break down the silane gas and the nitrous oxide gas, thus providing silicon radicals and oxygen radicals to form the lower silicon dioxide layer 330. For other wafer sizes, the RF power may be provided at a power level of 350 milliwatts to 565 milliwatts per square centimeter of wafer area. The first PECVD process may incorporate up to 5 atomic percent nitrogen in the lower silicon dioxide layer 330, from the nitrous oxide gas. The lower silicon dioxide layer 330 is 3 nanometers to 7 nanometers thick, which may require the first PECVD process to proceed for 5 seconds to 15 seconds.

Referring to FIG. 3B, a silicon oxy-nitride layer 332 of the capacitor dielectric layer 316 may be formed over the lower silicon dioxide layer 330, in the same process tool, without exposing the lower silicon dioxide layer 330 to room atmosphere. The phrase exposing to room atmosphere is understood to include removing the microelectronic device 300 from a process tool to a region containing room atmosphere, and to include venting the process tool containing the microelectronic device 300 to room atmosphere. The silicon oxy-nitride layer 332 may be formed, for example, by a second PECVD process. The second PECVD process may include heating the microelectronic device 300 to 300° C. to 400° C., for example the same temperature used to form the lower silicon dioxide layer 330. Silane gas, denoted as "SiH$_4$" in FIG. 3B, is provided at a flow rate of 250 sccm to 350 sccm, for a 300 millimeter diameter wafer. For other wafer sizes, the silane gas may be provided at a flow rate of 0.35 sccm to 0.50 sccm per square centimeter of wafer area. Nitrous oxide gas, denoted as "N$_2$O" in FIG. 3B, is provided at a flow rate 2.0 to 3.0 times the flow rate of the silane gas. A carrier gas such as helium gas, denoted as "He" in FIG. 3B, is provided at a flow rate of 7000 sccm to 11000 sccm, for a 300 millimeter diameter wafer. For other wafer sizes, the carrier gas may be provided at a flow rate of 9.9 sccm to 15.5 sccm per square centimeter of wafer area. A pressure of the silane gas, the nitrous oxide gas, and the carrier gas is maintained at 4.5 torr to 6.5 torr. RF power, denoted as "RF" in FIG. 3B, is applied to the silane gas, the nitrous oxide gas, and the carrier gas at a power level of 150 watts to 250 watts, for a 300 millimeter diameter wafer, to break down the silane gas and the nitrous oxide gas, thus providing silicon radicals, nitrogen radicals, and oxygen radicals to form the silicon oxy-nitride layer 332. For other wafer sizes, the RF power may be provided at a power level of 210 milliwatts to 350 milliwatts per square centimeter of wafer area. The lower silicon dioxide layer 330 is 20 nanometers to 30 nanometers thick, which may require the disclosed PECVD process to proceed for 6 seconds to 7.5 seconds. The silicon oxy-nitride layer 332 has an average index of refraction of 1.85 to 1.95 at a wavelength of 248 nanometers.

Figure 3C:
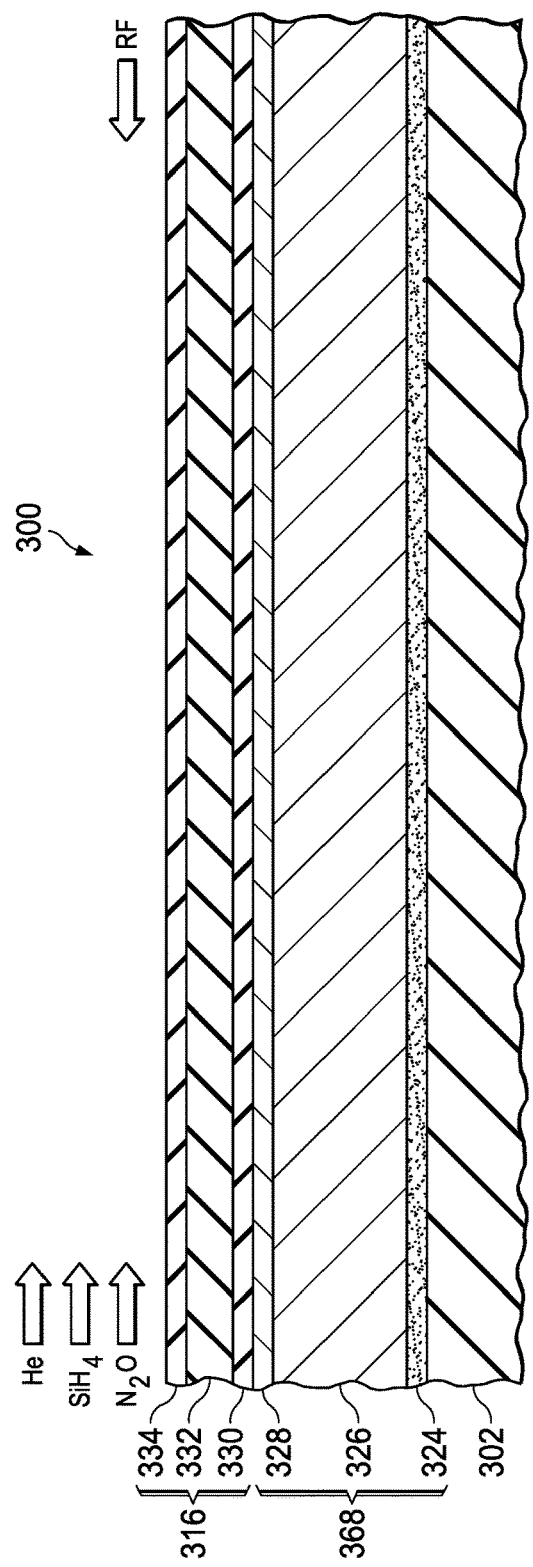

Referring to FIG. 3C, an upper silicon dioxide layer 334 of the capacitor dielectric layer 316 is formed on the silicon oxy-nitride layer 332. The upper silicon dioxide layer 334 may be formed, for example, by a third PECVD process using the same process parameter values as the first PECVD process disclosed in reference to FIG. 3A, operating for a longer time, for example, 15 seconds to 25 seconds, to provide a desired thickness of 8 nanometers to 12 nanometers for the upper silicon dioxide layer 334. The upper silicon dioxide layer 334 may be formed in the same tool as the silicon oxy-nitride layer 332, without exposing the silicon oxy-nitride layer 332 to room atmosphere.

Figure 3D:
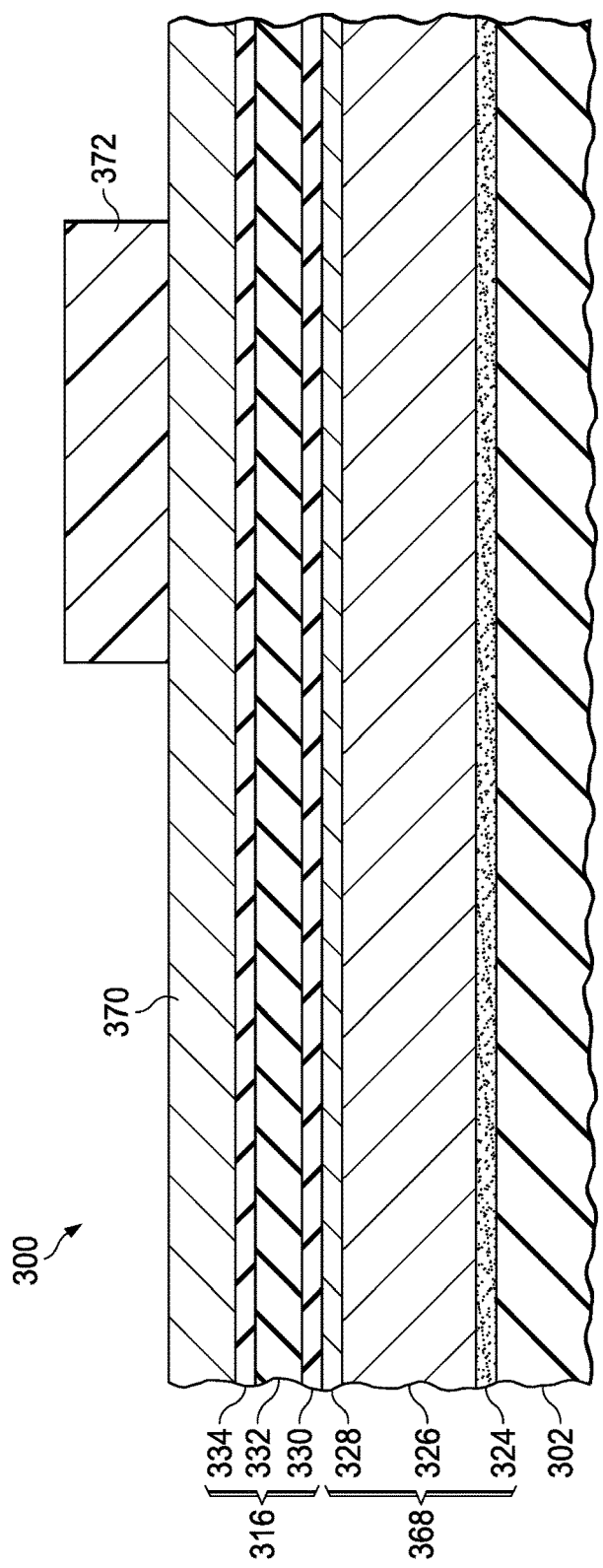

Referring to FIG. 3D, an upper plate layer 370 is formed on the capacitor dielectric layer 316. The upper plate layer 370 may include, for example, titanium nitride or tantalum nitride. The upper plate layer 370 may be formed by reactive sputtering or an ALD process. The upper plate layer 370 is sufficiently thick that a subsequent process to form a via hole over the capacitor will terminate in the upper plate layer 370 and not punch through to the capacitor dielectric layer 316. Furthermore, the upper plate layer 370 is sufficiently thin that a reactive ion etch (RIE) process to pattern the upper plate layer 370 will stop in the upper silicon dioxide layer 334, leaving a sufficient thickness, for example, 3 nanometers, of the upper silicon dioxide layer 334 to prevent nitrogen poisoning by the silicon oxy-nitride layer 332 of photoresist used in a photolithographic process used to pattern the interconnect metal layer 368. It has been demonstrated that forming the upper plate layer 370 which includes primarily titanium nitride with a thickness of 100 nanometers to 150 nanometers thick enables attainment of both criteria.

An upper plate mask 372 is formed over the upper plate layer 370. The upper plate mask 372 covers an area for a subsequently-formed upper plate of the capacitor. The upper plate mask 372 may include photoresist formed by a photolithographic process.

Figure 3E:
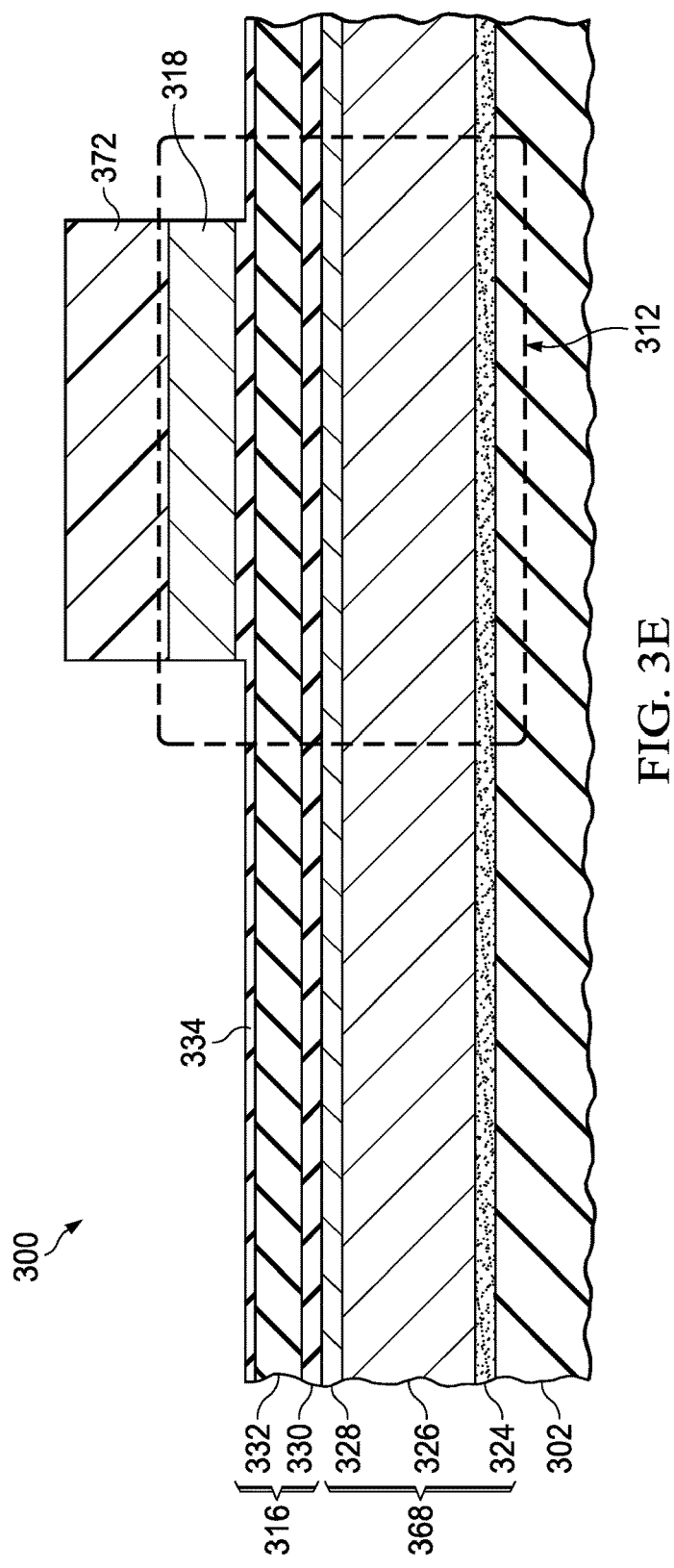

Referring to FIG. 3E, material is removed from the upper plate layer 370 of FIG. 3D where exposed by the upper plate mask 372, leaving the upper plate layer 370 under the upper plate mask 372 to form an upper plate 318 of the capacitor 312. The material may be removed from the upper plate layer 370 by an RIE process using chlorine ions, or by another plasma etch process. The process used to form the upper plate 318 may remove a portion of the upper silicon dioxide layer 334 where exposed by the upper plate 318, leaving a sufficient thickness, for example, 3 nanometers, of the upper silicon dioxide layer 334 to prevent nitrogen poisoning by the silicon oxy-nitride layer 332 of photoresist used in a photolithographic process used to pattern the interconnect metal layer 368. As RIE methods improve, it may be possible to form the upper plate 318 while leaving substantially all of the upper silicon dioxide layer 334 in place where exposed by the upper plate 318. In such circumstances, the thickness of the upper silicon dioxide layer 334 may be reduced to a thickness sufficient to prevent nitrogen poisoning.

The upper plate mask 372 is subsequently removed. The upper plate mask 372 may be removed, for example, by an asher process, followed by a wet clean process. Other methods for removing the upper plate mask 372, such as dissolution in organic solvents followed by a wet clean process, are within the scope of the instant example.

Figure 3F:
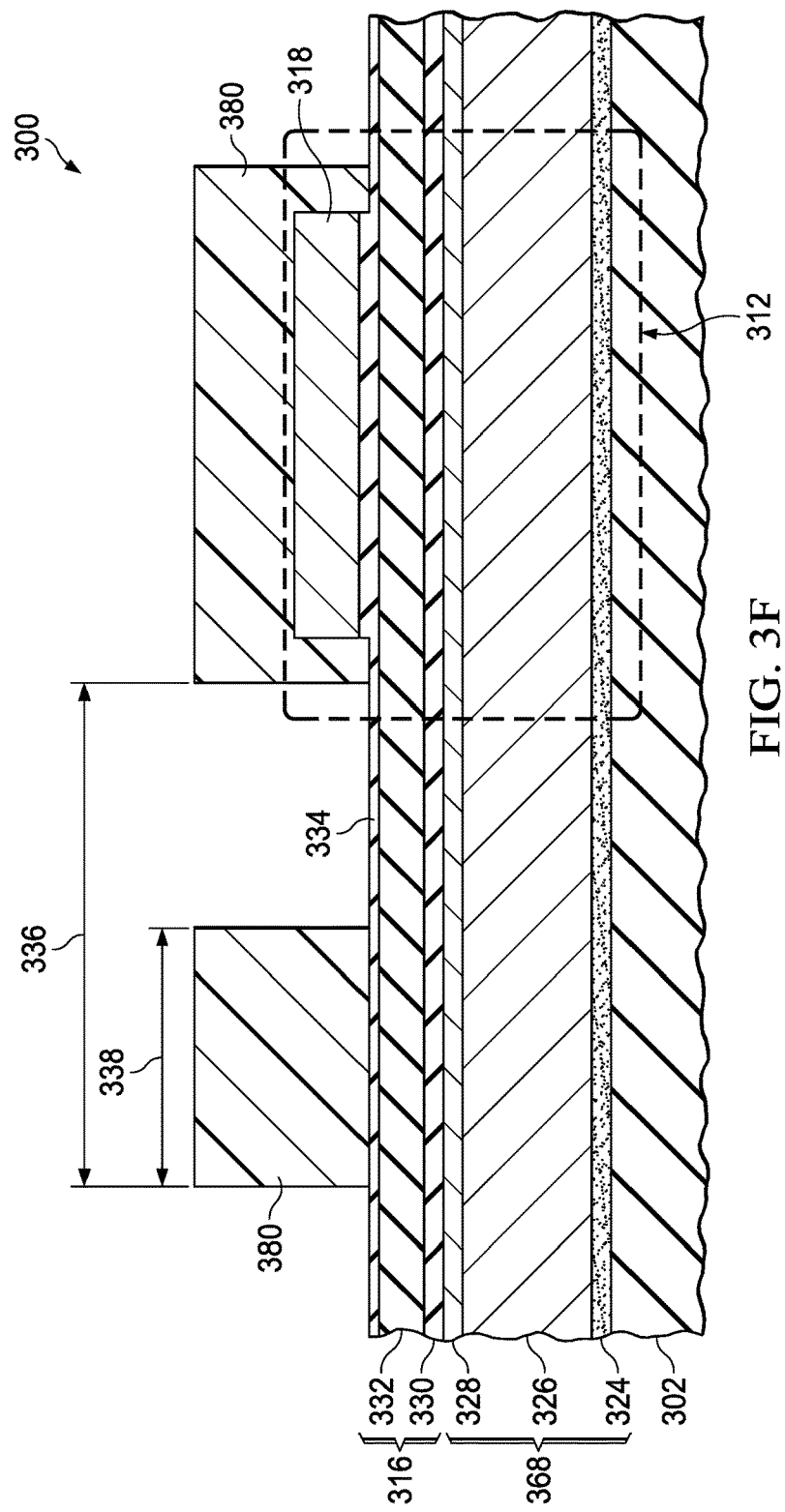

Referring to FIG. 3F, an interconnect mask 380 is formed over the capacitor dielectric layer 316 and the upper plate 318. Forming the interconnect mask 380 includes forming a layer of photoresist directly on the portion of the upper silicon dioxide layer 334 where exposed by the upper plate 318, and does not include forming a separate antireflection layer. The interconnect mask 380 is formed by a photolithographic process. The capacitor dielectric layer 316 provides an anti-reflection layer for the photolithographic process. The interconnect mask 380 covers areas for subsequently-formed interconnects of the interconnect metal layer 368 and for a subsequently-formed lower plate of the capacitor 312. A minimum pitch 336 of the interconnect mask 380, which may be expressed as a sum of a width 338 of a segment of the interconnect mask 380 and a width of an adjacent space, may be less than 420 nanometers, the photolithographic process using an illumination source having a wavelength of 248 nanometers. Using the capacitor dielectric layer 316 as the anti-reflection layer may advantageously enable attaining a minimum pitch 336 of 420 nanometers while reducing fabrication cost and complexity of the photolithographic process. Forming a separate anti-reflection layer over the upper plate 318 would complicate patterning the interconnect mask 380 close to edges of the upper plate 318. Moreover, using the capacitor dielectric layer 316 as the anti-reflection layer may advantageously enable harmonization of the photolithographic process with a similar photolithographic process for a second microelectronic device that does not include a capacitor, wherein the similar photolithographic process uses an anti-reflection layer with similar optical characteristics to the capacitor dielectric layer 316, thus reducing fabrication complexity and costs for the fabrication facility making the microelectronic device 300 and the second microelectronic device.

Figure 3G:
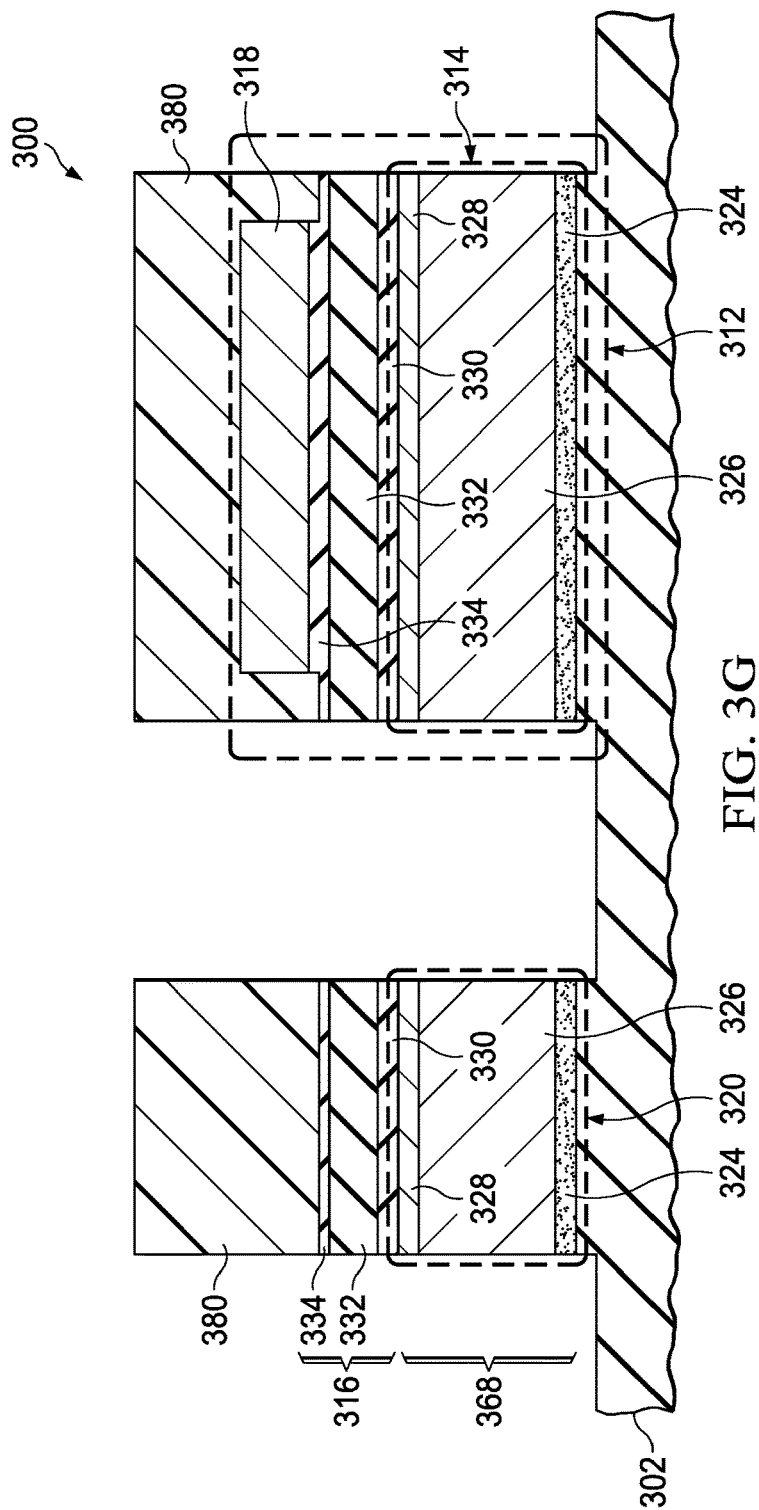

Referring to FIG. 3G, the interconnect metal layer 368 is patterned by an RIE process using the interconnect mask 380 to concurrently form a lower plate 314 of the capacitor 312 and an interconnect 320. The RIE process removes the capacitor dielectric layer 316 where exposed by the interconnect mask 380. The RIE process may use fluorine-containing gases to etch the capacitor dielectric layer 316, followed by chlorine-containing gases to etch the cap layer 328 of the interconnect metal layer 368 and the aluminum layer 326 of the interconnect metal layer 368. The adhesion layer 324 of the interconnect metal layer 368 may be etched by the same etch step used to etch the aluminum layer 326, or may be etched by another etch step.

The interconnect mask 380 is subsequently removed, leaving the capacitor dielectric layer 316 in place over the lower plate 314 where exposed by the upper plate 318 and over the interconnect 320. The interconnect mask 380 may be removed, for example, by an asher process followed by a wet clean process.

Figure 3H:
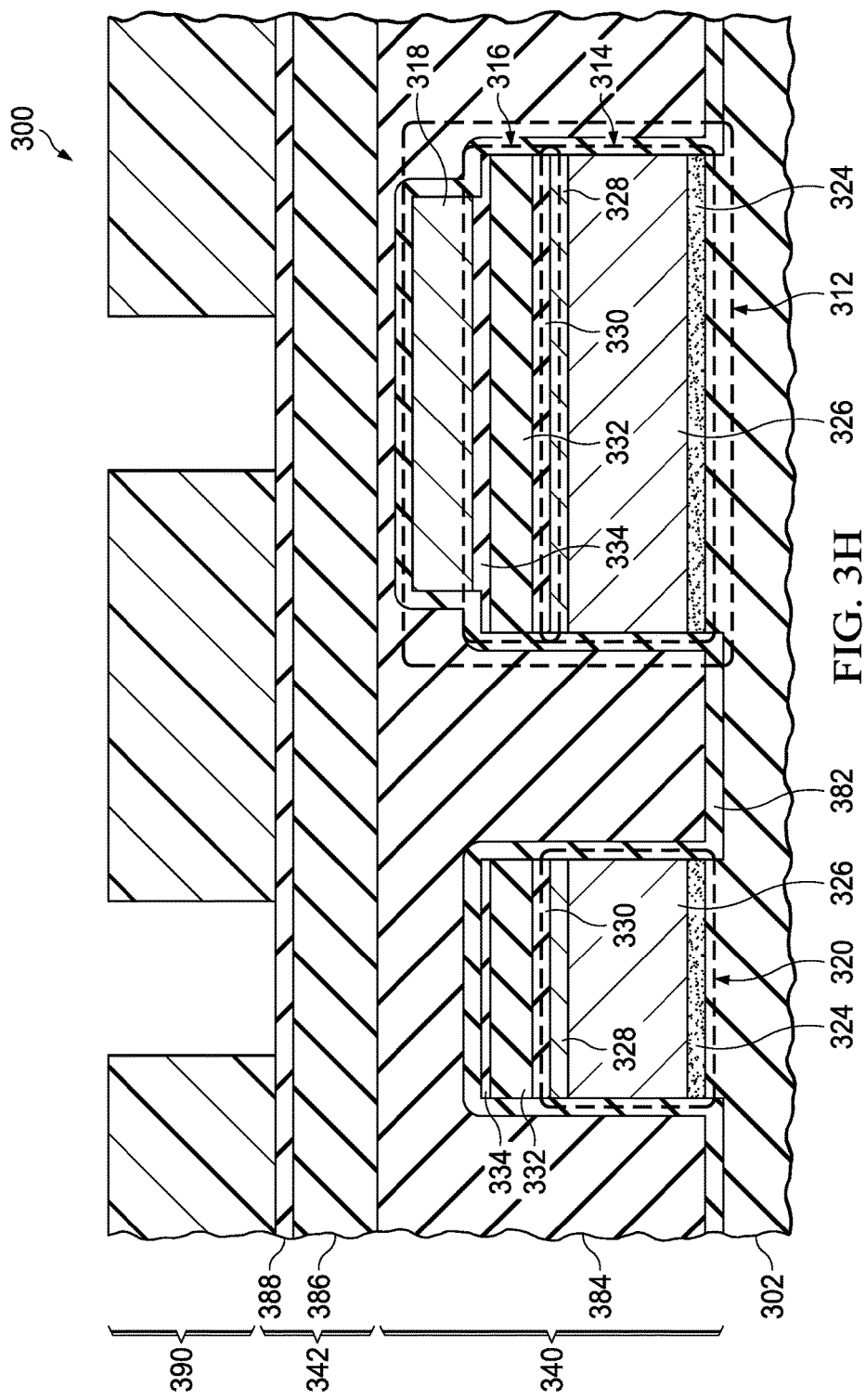

Referring to FIG. 3H, an IMD layer 340 is formed over the lower dielectric layer 302, the capacitor 312 and the interconnect 320. The IMD layer 340 of the instant example includes an etch stop layer 382 of silicon nitride, silicon oxy-nitride, or such, formed on the lower dielectric layer 302, the capacitor 312 and the interconnect 320. The etch stop layer 382 may be formed by a PECVD process using bis(tertiary-butyl-amino) silane (BTBAS), to provide a nitride-containing layer with low stress. The IMD layer further includes a main dielectric layer 384 of silicon dioxide, PSG, BPSG, low-k dielectric material, or such, formed on the etch stop layer 382. The main dielectric layer 384 may be formed by a PECVD process using TEOS. The main dielectric layer 384 may be planarized, as depicted in FIG. 3H, for example by an oxide CMP process.

An ILD layer 342 is formed on the IMD layer 340. The ILD layer 342 may include a main dielectric layer 386 of silicon dioxide or low-k dielectric material on the IMD layer 340, and a cap layer 388 of silicon nitride, silicon carbide, silicon oxy-nitride, silicon oxy-carbide, or other material appropriate for a polish stop layer for a subsequent metal CMP process, on the main dielectric layer 386.

A via mask 390 is formed over the ILD layer 342. The via mask 390 exposes areas over the capacitor 312 and the interconnect 320 for vias. The via mask 390 may include photoresist, formed by a photolithographic process, and may include an anti-reflection layer such as BARC. The via mask 390 may include hard mask material such as amorphous carbon. A vertical thickness of dielectric material of the ILD layer 342 and the IMD layer 340 over the capacitor 312 is less than a vertical thickness of the dielectric material of the ILD layer 342 and the IMD layer 340 over the interconnect 320, due to the presence of the upper plate 318 in the capacitor 312.

Figure 3I:
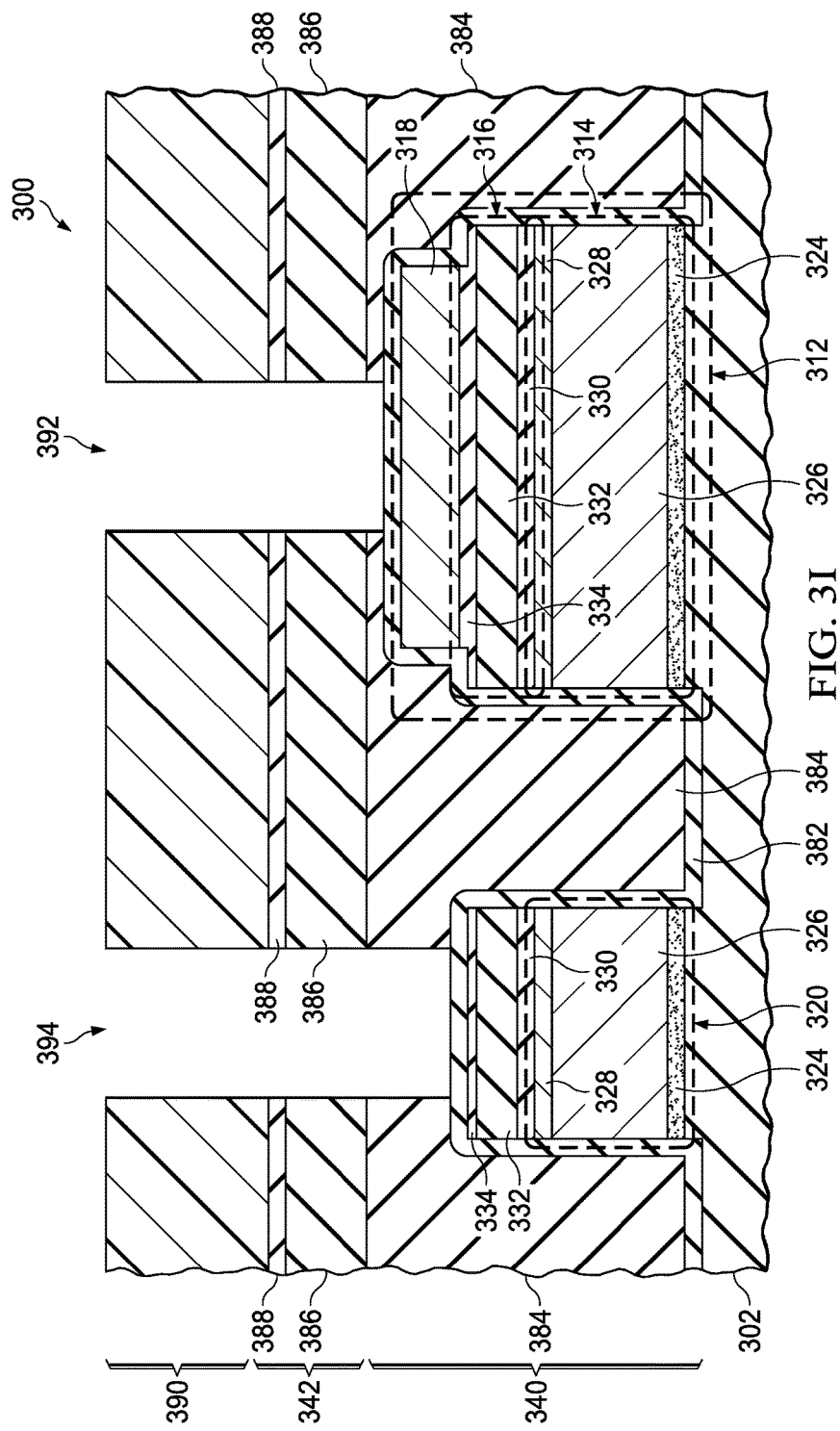

Referring to FIG. 3I, via holes 392 and 394 are formed through the ILD layer 342 and partway through the IMD layer 340, to the etch stop layer 382. The via holes 392 and 394 may be formed by an RIE process, using a first etch recipe to etch through the cap layer 388 of the ILD layer 342, and a second etch recipe to etch through the main dielectric layer 386 of the ILD layer 342 and the main dielectric layer 384 of the IMD layer 340. The etch stop layer 382 has a lower etch rate than the main dielectric layer 384 of the IMD layer 340, so the RIE process can etch the via hole 394 over the interconnect 320 to the etch stop layer 382 while not etching the via hole 392 over the capacitor 312 through the etch stop layer 382.

Figure 3J:
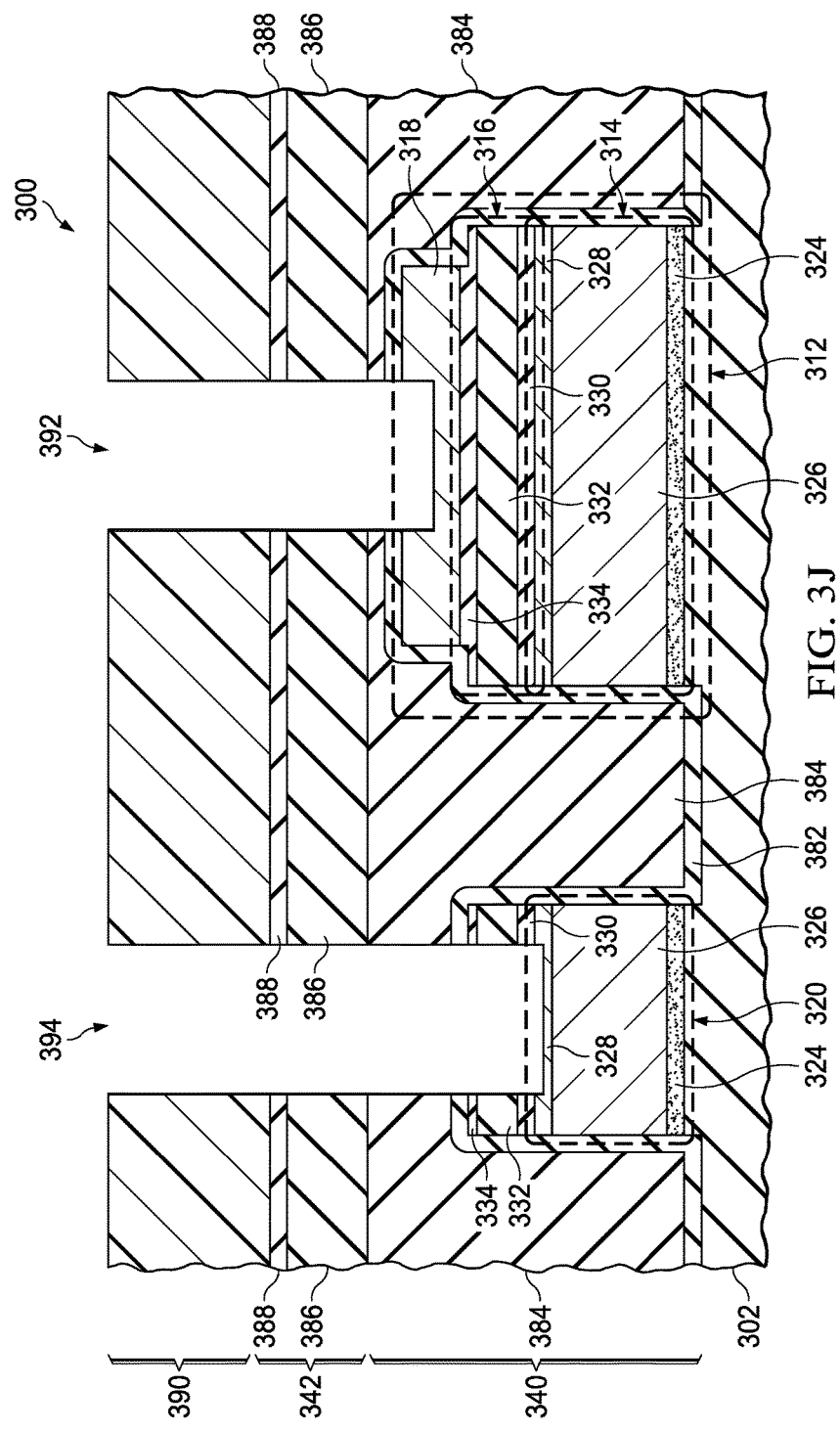

Referring to FIG. 3J, the via holes 392 and 394 are extended by the RIE process, described in reference to FIG. 3I, using a different etch recipe than that used to etch through the main dielectric layer 386 of the ILD layer 342 and the main dielectric layer 384 of the IMD layer 340. The via hole 392 over the capacitor 312 extends through the etch stop layer 382 to the upper plate 318. The via hole 394 over the interconnect 320 extends through the etch stop layer 382 and through the upper silicon dioxide layer 334, the silicon oxy-nitride layer 332, and the lower silicon dioxide layer 330, to the interconnect 320.

The via mask 390 is subsequently removed. Photoresist in the via mask 390 may be removed by an asher process followed by a wet clean process. Similarly, amorphous carbon in the via mask 390 may be removed by an asher process followed by a wet clean process.

Figure 3K:
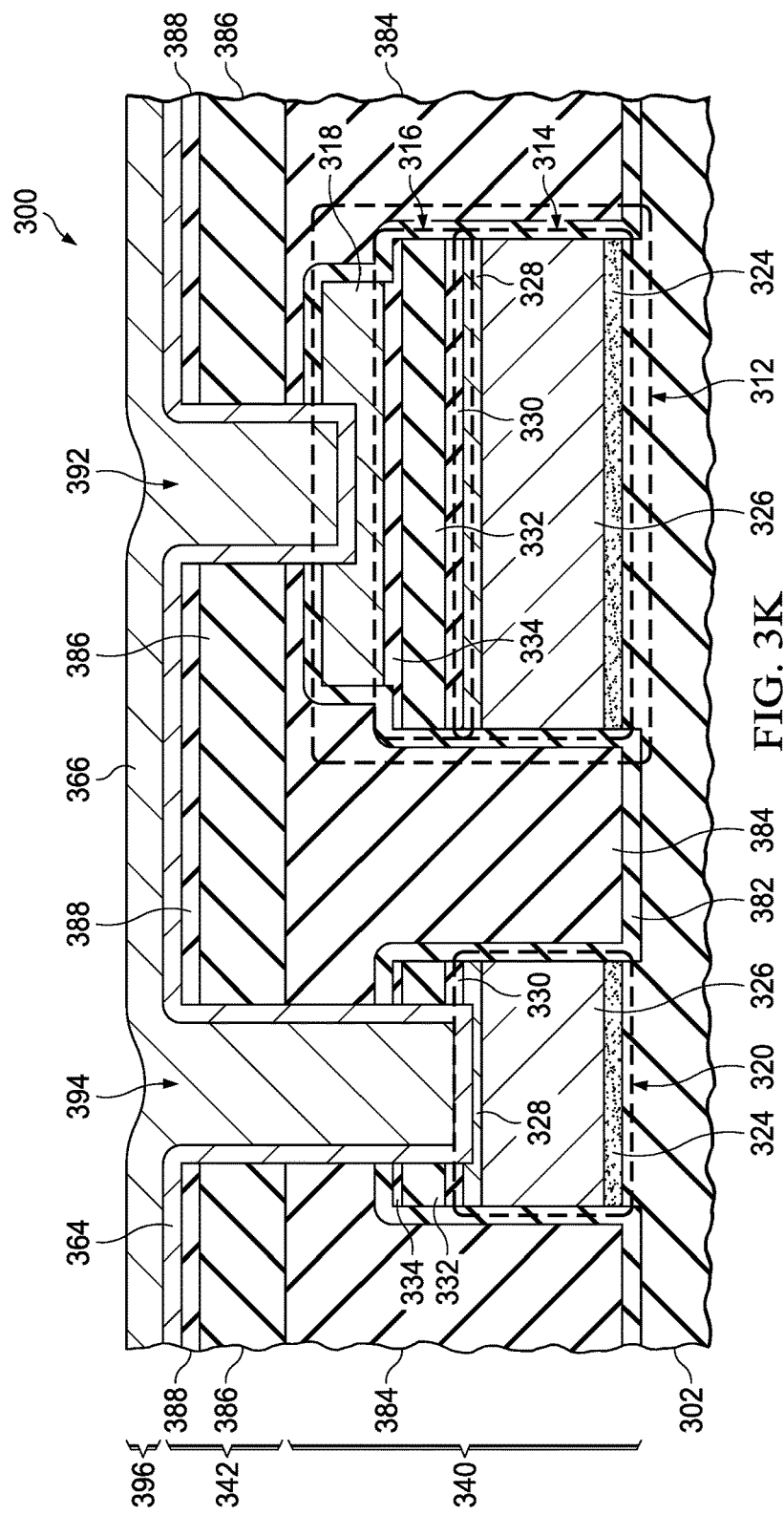

Referring to FIG. 3K, via metal 396 is formed over the ILD layer 342 so that the via metal extends into the via holes 392 and 394 and makes electrical contact to the upper plate 318 of the capacitor 312 and to the interconnect 320. The via metal 396 may include a liner 364 formed on the ILD layer 342, on sidewalls of the via holes 392 and 394, and on the upper plate 318 and the interconnect 320. The liner 364 may include a layer of titanium formed by sputtering followed by a layer of titanium nitride formed by reactive sputtering or an ALD process. The via metal 396 may further include fill metal 366 formed on the liner 364, extending into the via holes 392 and 394. The fill metal 366 may include tungsten formed by an MOCVD process using tungsten hexafluoride ($WF_6$) gas, initially reduced by silane gas and then reduced by hydrogen ($H_2$) gas.

Figure 3L:
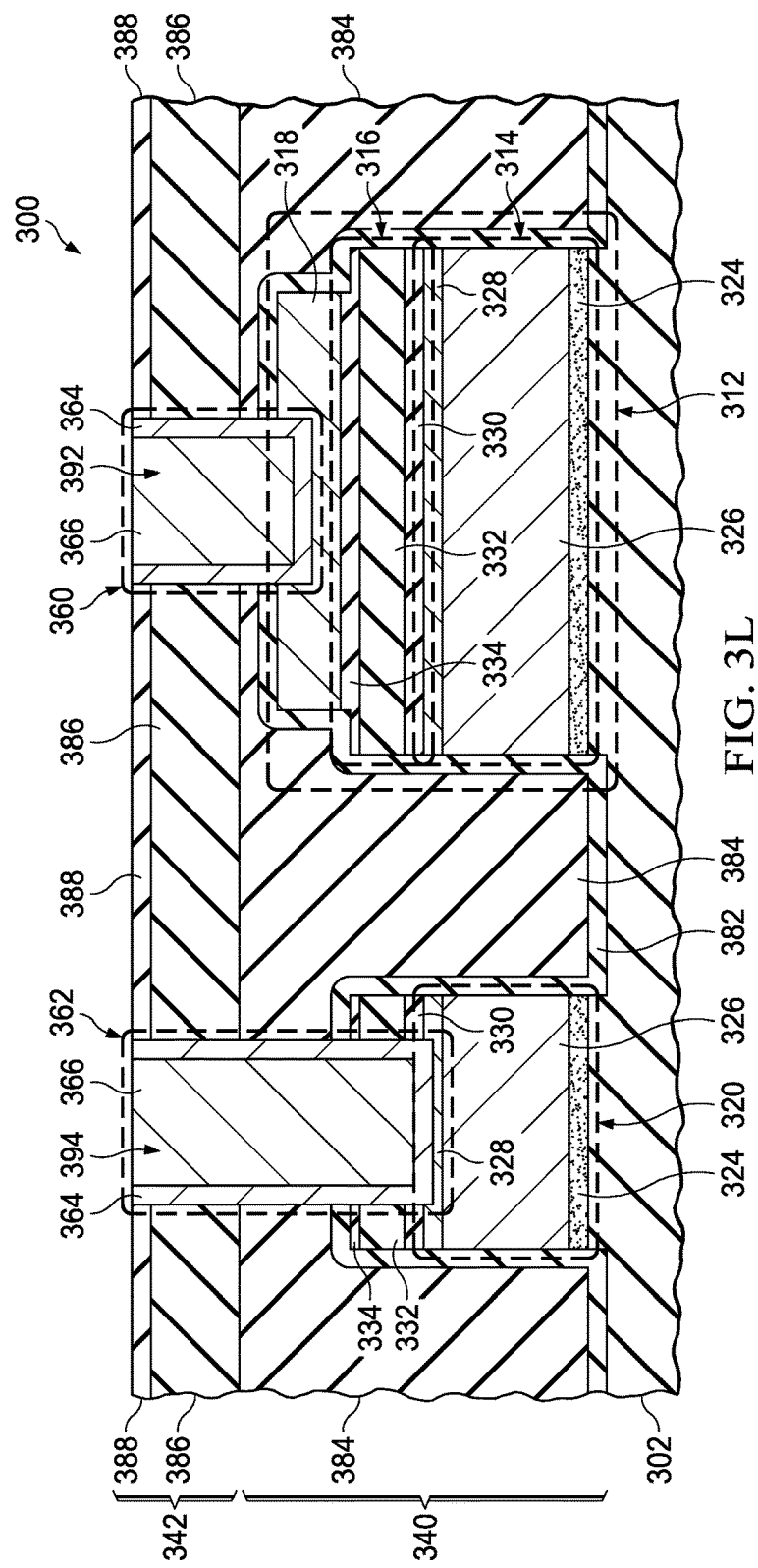

Referring to FIG. 3L, the fill metal 366 and the liner 364 are removed from over the ILD layer 342, leaving the fill metal 366 and the liner 364 in the via holes 392 and 394 to form a first via 360 making electrical contact to the upper plate 318 and a second via 362 making electrical contact to the interconnect 320. The fill metal 366 and the liner 364 may be removed from over the ILD layer 342 by a metal CMP process. The cap layer 388 may have a low polish rate in the metal CMP process, enabling complete removal of the fill metal 366 and the liner 364 from over the ILD layer 342 without removing any of the main dielectric layer 386 of the ILD layer 342. Forming the vias 360 and 362 concurrently through the ILD layer 342 enables subsequently-formed interconnects on the ILD layer 342 to be electrically connected to the capacitor 312 and the interconnect 320, which may advantageously simplify fabrication of the microelectronic device 300, compared to forming separate vias to the capacitor 312 and the interconnect 320.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
a lower dielectric layer;
a capacitor including:
   a lower plate on the lower dielectric layer;
   a capacitor dielectric layer on the lower plate, the capacitor dielectric layer including:
      a lower silicon dioxide layer over the lower plate;
      a silicon oxy-nitride layer over the lower silicon dioxide layer; and
      an upper silicon dioxide layer over the silicon oxy-nitride layer; and
   an upper plate over the capacitor dielectric layer, wherein:
      the upper plate is recessed from a lateral perimeter of the lower plate; and
      the capacitor dielectric layer includes an extended portion that extends on the lower plate past the upper plate, the silicon oxy-nitride layer having a same thickness in the extended portion and between the upper and lower plates, and the upper silicon dioxide layer being thicker between the upper and lower plates and thinner in the extended portion; and
an interconnect on the lower dielectric layer, wherein a noncontiguous portion of the extended portion of the capacitor dielectric layer is located over the interconnect.

2. The microelectronic device of claim 1, wherein:
the lower silicon dioxide layer has a thickness of 3 nanometers to 7 nanometers;
the silicon oxy-nitride layer has a thickness of 20 nanometers to 30 nanometers; and
upper silicon dioxide layer has a thickness of 8 nanometers to 12 nanometers.

3. The microelectronic device of claim 1, wherein the extended portion of the capacitor dielectric layer has a reflectivity less than 30 percent at a wavelength of 248 nanometers.

4. The microelectronic device of claim 1, wherein a thickness of the portion of the upper silicon dioxide layer extending past the upper plate is at least 3 nanometers.

5. The microelectronic device of claim 1, wherein the lower plate and the interconnect each include an aluminum layer including primarily aluminum and a cap layer over the aluminum layer, the cap layer including a material selected from the group consisting of titanium nitride and tantalum nitride.

6. The microelectronic device of claim 1, wherein the upper plate has a thickness of 100 nanometers to 150 nanometers, and includes a material selected from the group consisting of titanium nitride and tantalum nitride.

7. The microelectronic device of claim 1, wherein the interconnect is a first interconnect, and further comprising a second interconnect on the lower dielectric layer, a pitch of the first interconnect and the second interconnect being less than 420 nanometers, the pitch being a sum of a width of the second interconnect and a width of a space between the first interconnect and the second interconnect.

8. The microelectronic device of claim 1, wherein the lower dielectric layer is a first dielectric layer, and further comprising:
a second dielectric layer over the capacitor and the interconnect;
a first via through the second dielectric layer, the first via contacting the upper plate; and
a second via through the second dielectric layer, the second via contacting the interconnect.

9. The microelectronic device of claim 1, further comprising:
an inter-level dielectric layer (ILD) over the capacitor and the interconnect;
a first via through the ILD layer, the first via contacting the upper plate; and
a second via through the lower dielectric layer, the second via contacting the lower plate.

10. A method, comprising:
forming a lower dielectric layer of a microelectronic device;
forming an interconnect metal layer on the dielectric layer;
forming a multi-layer dielectric layer on the interconnect metal layer, including:
   forming a lower silicon dioxide layer over the interconnect metal layer;
   forming a silicon oxy-nitride layer over the lower silicon dioxide layer; and
   forming an upper silicon dioxide layer over the silicon oxy-nitride layer; and
forming an upper plate layer over the multi-layer dielectric layer;
removing the upper plate layer where exposed by an upper plate mask to form an upper plate of a capacitor, without exposing the silicon oxy-nitride layer, the removing leaving a thinned portion of the upper silicon dioxide layer where exposed by the upper plate;
forming an interconnect mask over the multi-layer dielectric layer and over the upper plate by a photolithographic process; and
removing the multi-layer dielectric layer and the interconnect metal layer where exposed by the interconnect mask thereby forming a lower plate of the capacitor and forming an interconnect of the interconnect metal layer.

11. The method of claim 10, wherein forming the lower silicon dioxide layer includes a plasma enhanced chemical vapor deposition (PECVD) process that includes:
providing silane gas at a flow rate of 0.04 standard cubic centimeters per minute (sccm) to 0.07 sccm per square centimeter of wafer area of a wafer containing the microelectronic device; and
providing nitrous oxide gas at a flow rate within a range of 30 times to 40 times the flow rate of the silane gas.

12. The method of claim 10, wherein forming the silicon oxy-nitride layer includes a PECVD process that includes
providing silane gas at a flow rate of within a range of 0.35 sccm to 0.50 sccm per square centimeter of wafer area of a wafer containing the microelectronic device; and
providing nitrous oxide gas at a flow rate within a range of 2.0 times to 3.0 times the flow rate of the silane gas.

13. The method of claim 10, wherein the silicon oxy-nitride layer has a thickness within a range between about 20 nanometers and about 30 nanometers.

14. The method of claim 10, wherein forming the upper silicon dioxide layer includes a PECVD process that provides:

silane gas at a flow rate within a range of 0.04 sccm to 0.07 sccm per square centimeter of wafer area of a wafer containing the microelectronic device; and nitrous oxide gas at a flow rate within a range of 30 times to 40 times the flow rate of the silane gas.

15. The method of claim 10, wherein the upper silicon dioxide layer is 8 nanometers to 12 nanometers thick.

16. The method of claim 10, wherein a combined stack of the lower silicon dioxide layer, the silicon oxy-nitride layer, and the thinned portion of the upper silicon dioxide layer on the interconnect metal layer have a reflectivity less than 30 percent at a wavelength of 248 nanometers.

17. An integrated circuit, comprising:

an intrametal dielectric (IMD) layer located over a substrate;

an interconnect line and a capacitor located within the IMD layer, the capacitor including a lower plate and an upper plate; and a dielectric stack having a nitrogen-containing layer between a lower silicon dioxide layer and an upper silicon dioxide layer, the dielectric stack including first and second noncontiguous portions, the first noncontiguous portion being located on the interconnect line and the second noncontiguous portion being located between the lower and upper plates, the second noncontiguous portion including a thicker region located between and contacting the lower and upper plates and a thinner region located between and contacting the lower plate and the IMD layer, the upper silicon dioxide layer being thinner in the thinner region and the upper silicon dioxide layer being thicker in the thicker region.

18. The integrated circuit of claim 17, wherein the first noncontiguous portion of the capacitor dielectric layer has a reflectivity less than 30 percent at a wavelength of 248 nanometers.

19. The integrated circuit of claim 17, wherein the dielectric stack comprises a layer of silicon oxy-nitride in direct contact with the upper silicon dioxide layer and the lower silicon dioxide layer.

20. The integrated circuit of claim 17, wherein the nitrogen-containing layer has a same thickness in the first noncontiguous region, the thinner region and the thicker region.

* * * * *